United States Patent
Hardy et al.

(10) Patent No.: US 7,253,694 B2
(45) Date of Patent: Aug. 7, 2007

(54) TEMPERATURE COMPENSATED OVEN CONTROLLED CRYSTAL OSCILLATOR

(75) Inventors: Nigel Hardy, Norfolk (GB); Karl Ward, Norfolk (GB)

(73) Assignee: C-Mac Quartz Crystals, Limited, Essex (GB)

( * ) Notice: Subject to any disclaimer, the term of this patent is extended or adjusted under 35 U.S.C. 154(b) by 0 days.

(21) Appl. No.: 10/891,501

(22) Filed: Jul. 15, 2004

(65) Prior Publication Data
US 2006/0012446 A1 Jan. 19, 2006

(51) Int. Cl.
*H03L 1/00* (2006.01)

(52) U.S. Cl. .................. 331/176; 331/66; 331/158; 331/68; 331/69

(58) Field of Classification Search ............... 331/176, 331/66, 175, 158, 68, 69
See application file for complete search history.

(56) References Cited

U.S. PATENT DOCUMENTS

| | | | |
|---|---|---|---|
| 4,079,280 A * | 3/1978 | Kusters et al. ............. | 310/318 |
| 4,560,959 A | 12/1985 | Rokos et al. | |
| 6,362,699 B1 | 3/2002 | Fry ............................ | 331/176 |
| 6,362,700 B1 | 3/2002 | Fry ............................ | 331/176 |
| 6,501,340 B1 | 12/2002 | Flood | |
| 6,549,055 B2 | 4/2003 | Rokos | |
| 6,661,302 B1 * | 12/2003 | Rathore et al. ............. | 331/158 |
| 2002/0060597 A1 | 5/2002 | Rokos et al. ............... | 327/317 |

OTHER PUBLICATIONS

C-MAC "Crystal Product Data Book 2000", 3 pages.
International Search Report for PCT/IB2005/001981, Mailed Dec. 15, 2005.

* cited by examiner

*Primary Examiner*—Arnold Kinkead
(74) *Attorney, Agent, or Firm*—BainwoodHuang

(57) ABSTRACT

A method provides a temperature controlled frequency source. The method reduces the effects of temperature variations on an operating frequency of the temperature controlled frequency source by temperature compensating the temperature controlled frequency source.

8 Claims, 8 Drawing Sheets

TEMPERATURE COMPENSATED OVEN CONTROLLED CRYSTAL OSCILLATOR

FIELD OF THE INVENTION

The present invention relates to Temperature Compensated Oven Controlled Crystal Oscillator ("TCOCXO").

DESCRIPTION OF BACKGROUND INFORMATION

It is known to place a Temperature Compensated Crystal Oscillator ("TCXO") in an oven to maintain the temperature of the TCXO within a predetermined operating range, as disclosed in U.S. Pat. No. 6,501,340 ("the '340 patent"). Because of size, complexity and cost constraints, full oven control of a TCXO is not feasible in small packages and at best only the crystal package and oscillator circuitry can be partially controlled. Thermal gradients are imposed across the structure and so a temperature difference between the crystal and the temperature compensation circuit is created, this temperature difference varies with ambient temperature as does the required power. This can substantially degrade the temperature compensation, thereby making a very good TCXO worse.

BRIEF DESCRIPTION OF THE DRAWINGS

In the drawings, like reference numerals represent similar parts of the illustrated embodiments of the present invention throughout the several views and wherein.

DETAILED DESCRIPTION

The frequency stability of a TCXO may be greatly improved if kept wholly isothermal. The TCXO may be placed in an isothermal enclosure such as used for a traditional Oven Controlled Crystal Oscillator ("OCXO"). The isothermal enclosure may include a copper and/or aluminum block, where the components of the TCXO (e.g., crystal, oscillator, etc.) may be fixed thereon and/or therein. A heat shield is required to keep the crystal and oscillator isothermal, thereby minimizing thermal gradients across the TXCO. The performance of the Oven Controlled Temperature Compensated Crystal Oscillator ("OCTCXO") may be further improved by (1) using a crystal angle where the turnover temperature, area of low/zero temperature coefficient, matches the control temperature of the oven and/or (2) biasing the compensation in the temperature region of the control temperature of the oven.

Thermal compensation may also be used to nullify a lack of temperature control (e.g., very tight temperature control) and/or a temperature gradient imposed by size, power and/or cost constraints. The thermal compensation may be applied after the temperature control has been established, so the particular frequency stability characteristics of individual oscillators can be measured and corrected.

Figure 1:
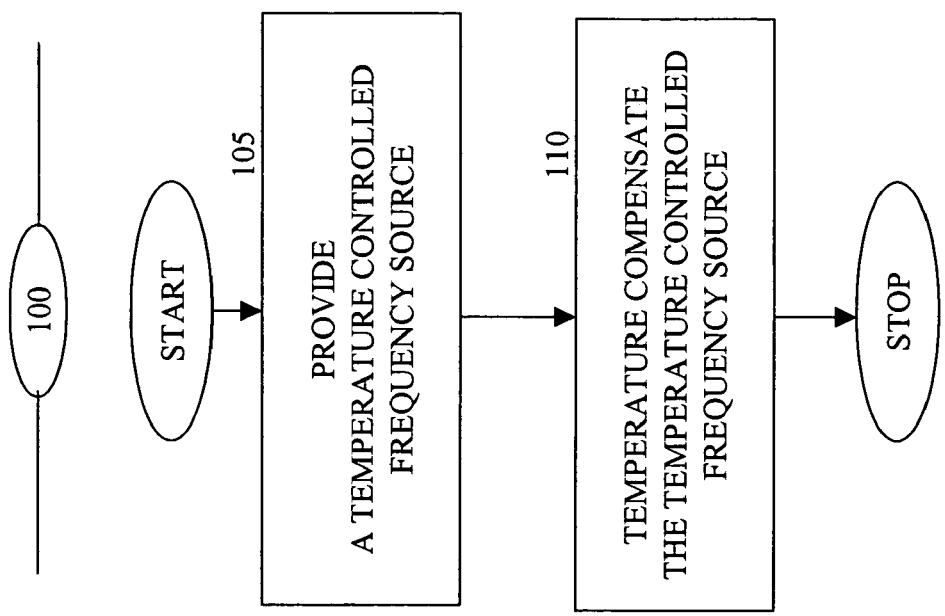
FIG. 1 depicts an embodiment of a method for temperature compensating a temperature controlled frequency source.

FIG. 1 illustrates one implementation of a method 100. In block 105, the method 100 provides a temperature controlled frequency source. In block 110, the method 100 temperature compensates the temperature controlled frequency source.

Figure 2:
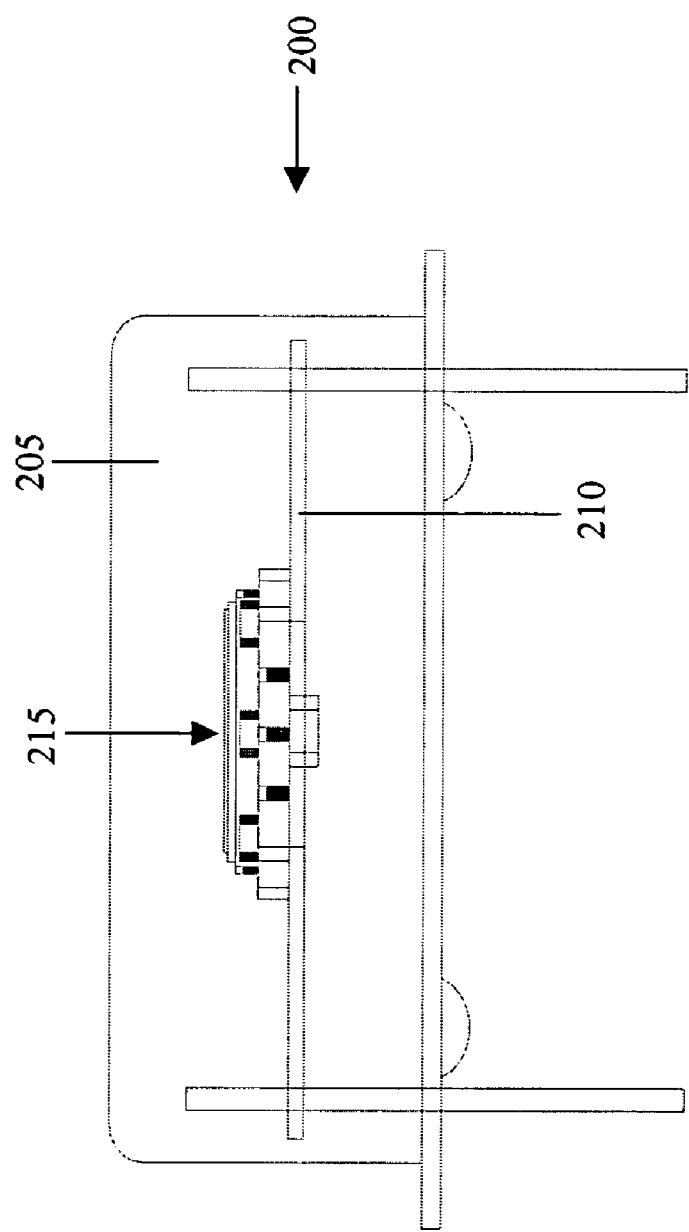
FIG. 2 depicts an embodiment of a TCOCXO assembly.

FIG. 2 illustrates one embodiment of a TCOCXO 200 that, for example, removes the necessity of very tight temperature control of an "oven." The TCOCXO utilizes a hermetic case 205, a support board 210 and/or an oven block assembly 215. The hermetic case may be filled with a thermal insulation gas such as, for example, Xenon. The TCOCXO may include a programmable temperature compensation Application Specific Integrated Circuit ("ASIC") to remove frequency errors from the OCXO.

Figure 4:
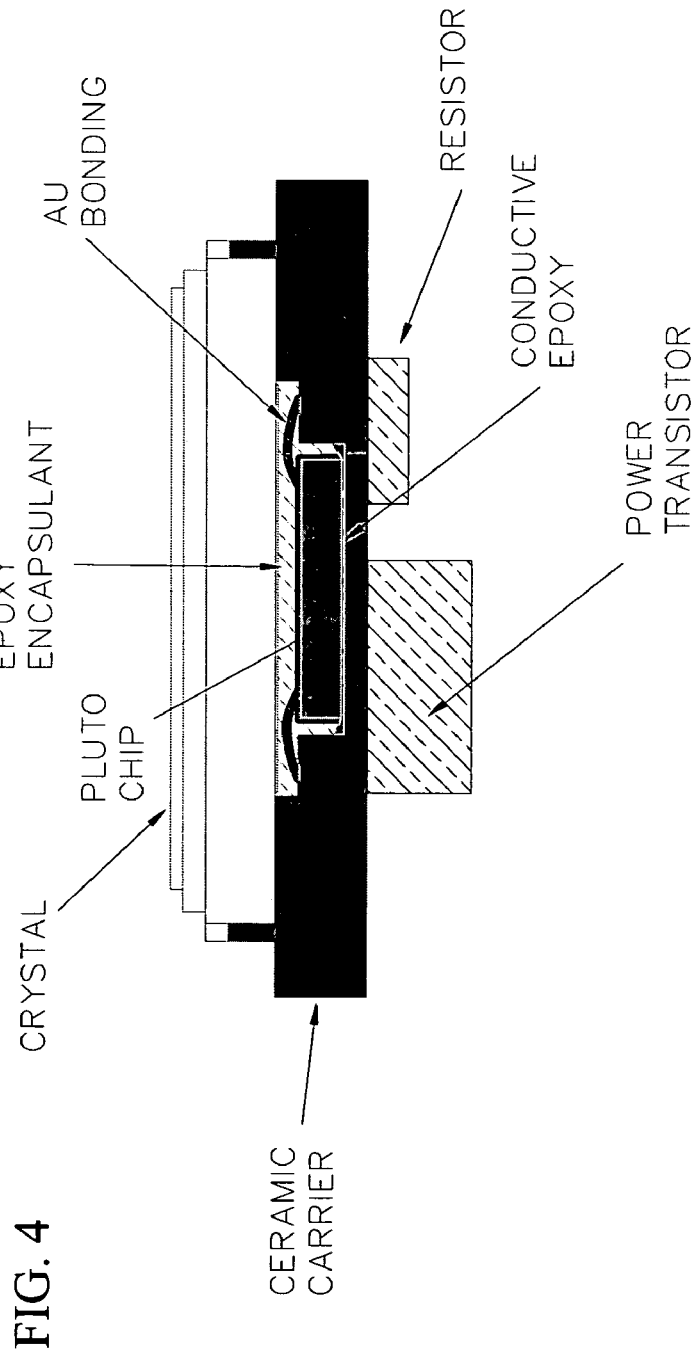
FIG. 4 depicts an embodiment of an oven block assembly.

FIG. 4 illustrates the temperature compensation ASIC fitted within a cavity in an upper side of a ceramic block. The cavity may be filled with epoxy. Heating devices may be fitted to a lower side of the ceramic block and a crystal may be disposed on an upper face of the ceramic block, for example, directly over the sealed-cavity containing the temperature compensation ASIC.

Figure 5:
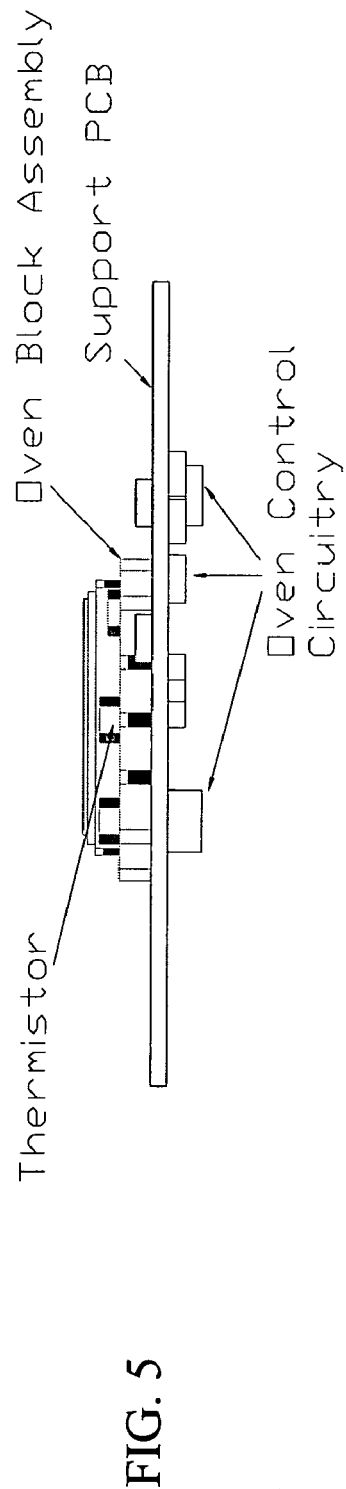
FIG. 5 depicts the oven block assembly of FIG. 4 mounted on an embodiment of a support board.

A heater and a temperature sensor may be located on the ceramic block, as illustrated in FIG. 5. The temperature sensor and/or the crystal may also be disposed (directly and/or indirectly) on a top face of the sealed-cavity having the temperature compensation ASIC, and the heater may be disposed (directly and/or indirectly) on a bottom face of the ceramic block. The temperature sensor may further be disposed on the bottom face of the ceramic block. The ceramic block may include all interconnections for the TCXO with the crystal and may include additional connections to allow remote access to the temperature sensor and heating devices.

The ceramic block is heated to a fairly constant temperature. A control circuit that controls a heater is located on a support board (e.g., a support Printed Circuit Board ("PCB")), as illustrated in FIGS. 4 and 5. The heater and a temperature sensor are mounted on the ceramic block. An ambient temperature sweep is performed with the heater activated and a frequency from a crystal is recorded. The TCOCXO is controlled such that the temperature of the crystal is allowed to move slightly (e.g., a few degrees) and utilizes, for example, a lower quality oven than OCXO devices. The temperature sweep provides frequency vs. ambient temperature results that allow corrections to be set into the temperature compensation ASIC to remove the frequency deviations left by the oven control.

A temperature of the TCOCXO may be set on the basis of standard OCXO principals, e.g., just above an operating temperature for minimum power consumption and/or at zero-temperature coefficient points of the crystal for best compensation. If an activity dip (which causes frequency instability in the output of an oscillator) occurs in a temperature region, the performance of the device with the activity dip is tested and evaluated for rejection. The TCOCXO should not include activity dips in the range the heating circuit controls the temperature. Activity dips of a crystal occur in any temperature range, reducing the temperature range of the crystal reduces the risk of finding them.

The TCOCXO produces higher frequency stability than a conventional TCXO with greatly reduced size and power consumption than an OCXO. Also, better performance can be achieved by the approach of the TCOCXO that reduces residual errors in frequency temperature characteristics left by a less well controlled oven than by the approach of the '340 patent that tries to heat a finished TCXO.

Figure 3:
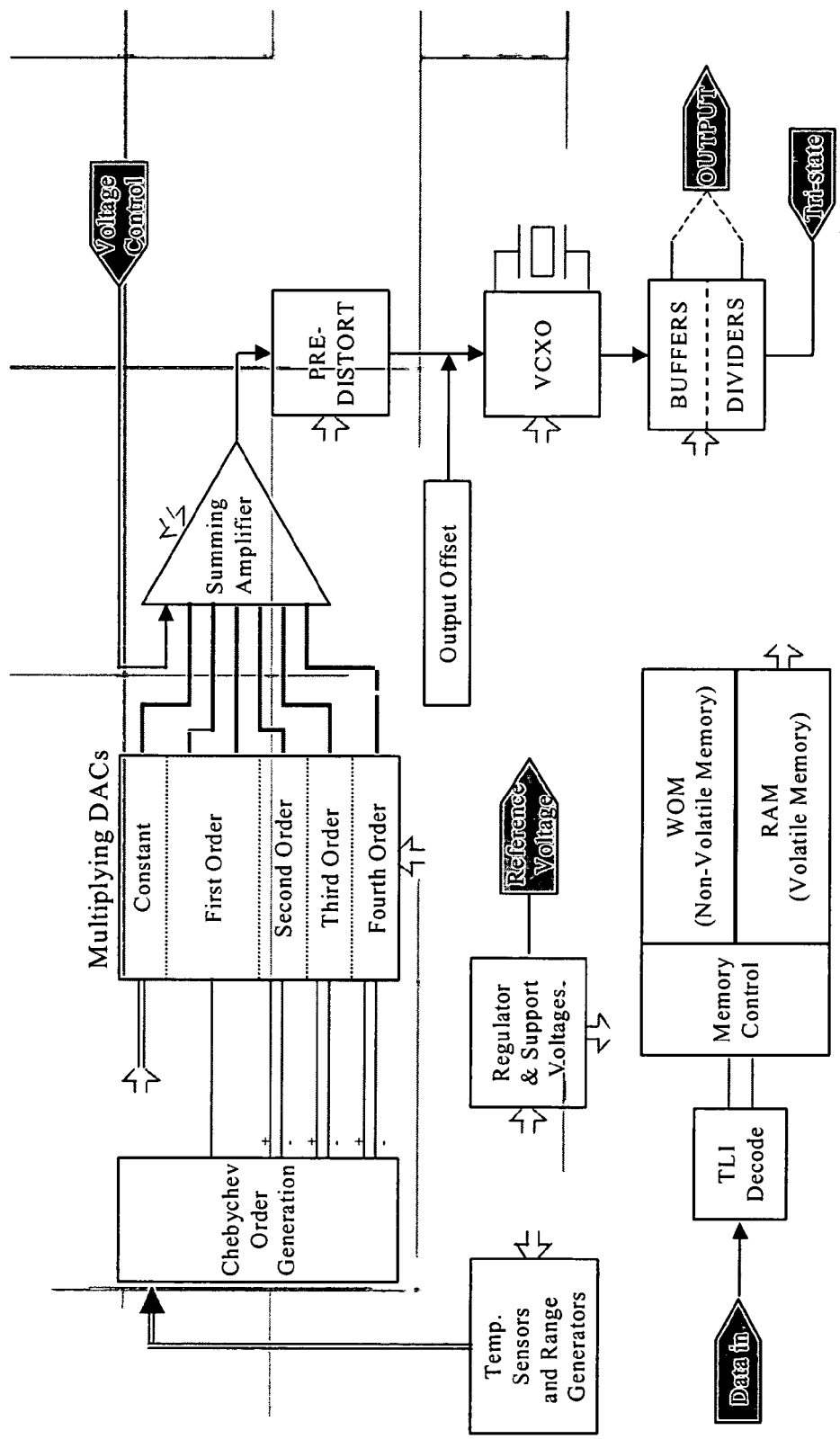
FIG. 3 depicts an embodiment of a block diagram for a temperature compensator.

The temperature compensation ASIC of the TCOCXO may be C-MAC's "Pluto" ASIC. C-MAC has a long history in developing ASIC devices, where U.S. Pat. No. 4,560,959 to Rokos et al., hereby incorporated by reference, describes one embodiment of temperature compensation. The temperature compensation ASIC such as, for example, the "Pluto" ASIC may incorporate features as disclosed in U.S. Pat. No. 6,549,055 to Rokos (method and apparatus for generating an input signal for a parameter sensitive signal) and U.S. application Ser. No. 10/485,583 (variable reactance tuning circuit), which both are hereby incorporated by reference. FIG. 3 illustrates a block diagram of one embodiment of the "Pluto" ASIC. A varactor is used to tune a frequency, where the reactance is controlled by a voltage at a summing amplifier. The TCOCXO may utilize an ASIC to enhance performance and/or reduce the size and cost of the finished module.

The temperature compensation ASIC may be an analog temperature compensation chip. The Pluto device, for example, includes a high degree of functionality, including digitally controlled analog temperature compensation, frequency adjustment by voltage control ("frequency pulling"), linearization of frequency pulling, overtone selection, synchronous voltage multiplication for low-voltage operation, and three different output buffers all with tristate.

Pluto's function includes fourth-order analog temperature compensation of output frequency, achieved by generating zero to fourth-order polynomial Chebyshev functions of temperature. These functions are weighted via multiplying D/A converters, superimposed through a summing amplifier and applied to a Voltage Controlled Crystal Oscillator ("VCXO") signal generator. The Pluto allows the TCOCXO to use fourth-order compensation with stability previously only available using larger, more expensive digitally compensated or higher-order analog compensated devices.

The output frequency of the temperature compensated VCXO is determined by the sum of the internally generated compensation voltage and the externally applied adjustment voltage. Without correction, non-linearities in the frequency vs. voltage characteristic of the VCXO result in the frequency vs. temperature characteristic of the device being dependent on the adjustment voltage. This is known as 'trim skew.' Additionally, the slope of the frequency vs. voltage curve will be a function of temperature due to the temperature dependence of the crystal and of the varactor diode, limiting the temperature stability achievable.

Both of these effects are minimized in the "Pluto" ASIC, which includes a circuit block inserted before the VCXO. The weighted sum of the compensation and adjustment voltages form the input to this circuit block, while the output is the voltage applied to the varactor, adjusting the frequency of the VCXO. As described in the '055 patent, the non-linear transfer function of the block can be digitally programmed to accurately compensate for the non-linearity of the VCXO's frequency adjustment. A temperature sensor provides an additional input to the block. This is used to control the overall gain of the circuit in such a way as to correct for the temperature dependence of the crystal and the varactor.

The result is that a highly linear VCXO is achieved with constant voltage sensitivity over the temperature range. This in turn allows exceptional frequency vs. temperature stability to be achieved over the whole adjustment voltage range. The digital control of the multiplying DACs used in the linearization allows individual settings to be made, giving optimum results for each oscillator.

Figure 6:
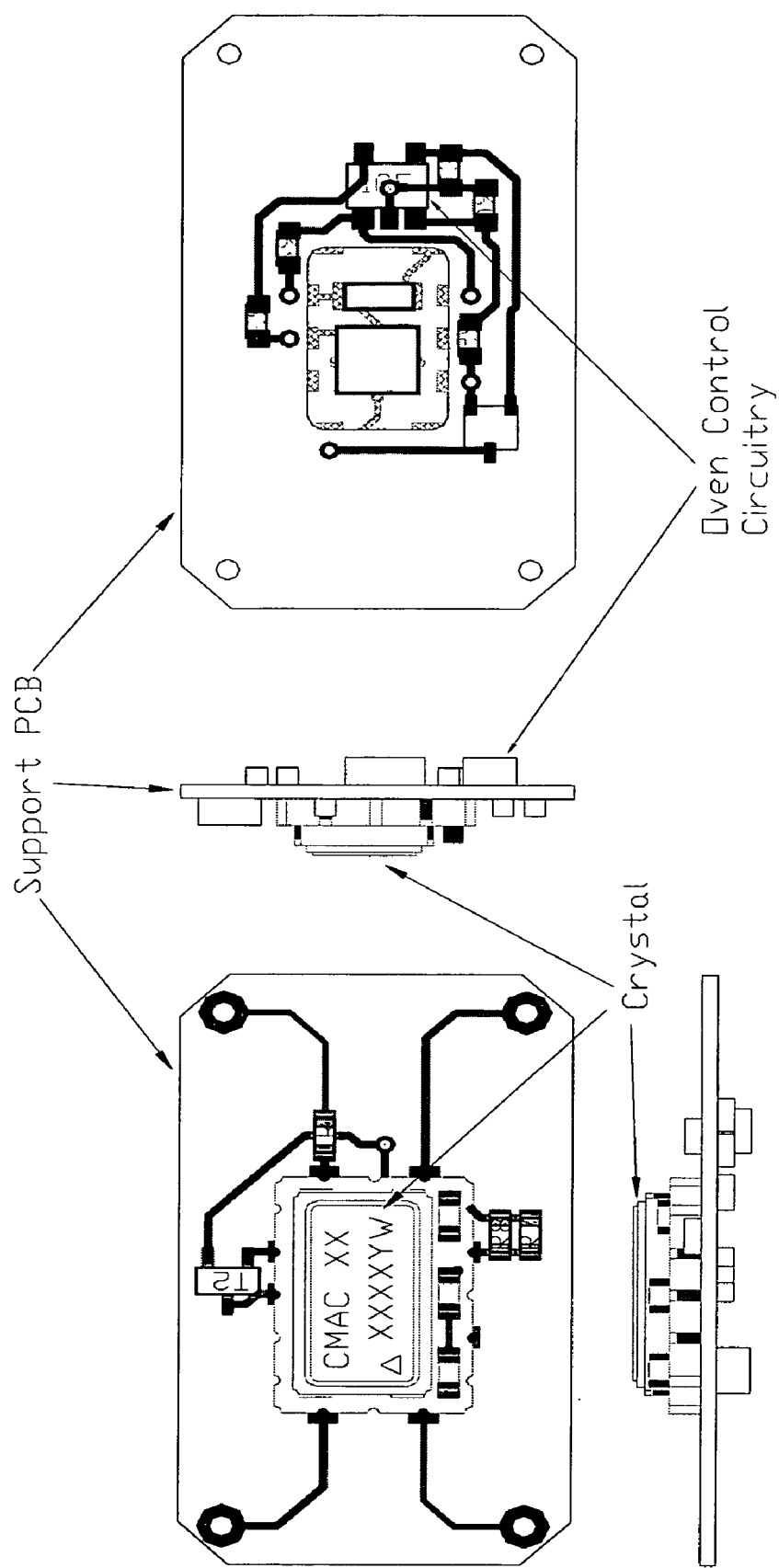
FIG. 6 depicts different views of the support board of FIG. 5.
Figure 7:
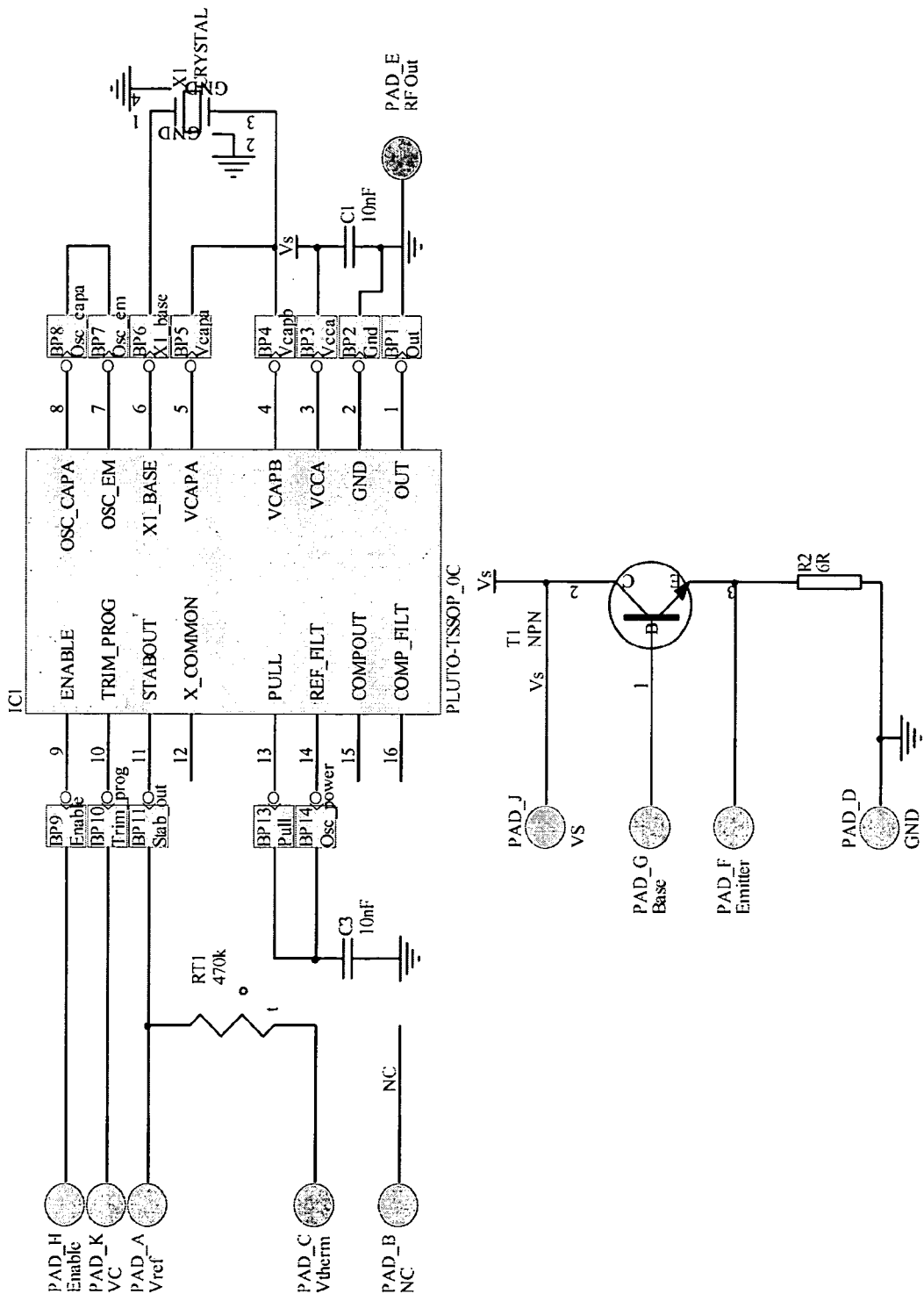
FIG. 7 depicts an embodiment of a circuit schematic for ceramic block, oscillator, crystal, thermistor, heater and compensation circuits.
Figure 8:
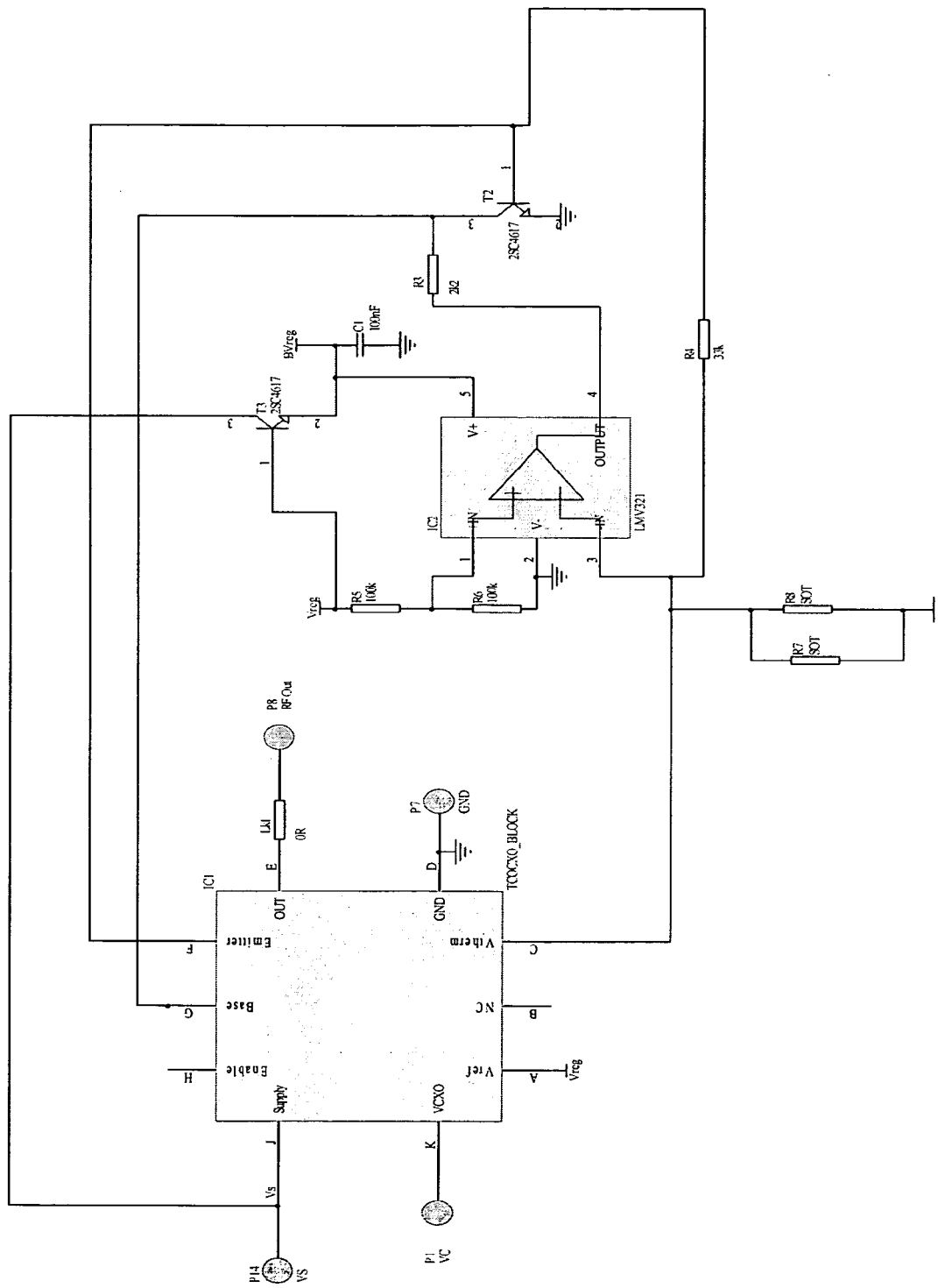
FIG. 8 depicts an embodiment of a PCB schematic for ceramic block and oven control circuit.

In one embodiment, a TCOCXO includes a temperature compensation circuit, an oscillator (including varactor), a crystal, a thermistor, a heater transistor (and current sense/heater resistor), and an interconnection that are integrated into and/or on a ceramic interconnect block, as illustrated in FIGS. 4, 5 and 6. The thermistor is used for the temperature sensing circuit for the heating control. FIG. 7 illustrates circuit schematics, including the ceramic block, oscillator, crystal, thermistor, heater and compensation circuits. Only an oven control circuit may be mounted on a support PCB, as illustrated in FIGS. 5 and 6. FIG. 8 illustrates a PCB schematic, including the ceramic block and the oven control circuit. The oven control may be set up for various temperature control schemes, as described below. An ASIC may integrate the oscillator, the varactor, the compensation (thermal and/or frequency voltage control linearity), the voltage regulator, the communication and/or the memory functions.

For example, CMAC's TCXO ASICs (original $6^{th}$ order ASIC circa 1995) including the "Pluto" ASIC include a communication interface configured to be shared to minimize the number of connections. The ASIC utilizes a single pin communication which is shared with a voltage control input. After programming, the programming interface is shut down and may form no function in the final product to avoid false communication with the ASIC. A frequency output pin is also used for status communication out of the ASIC. As a result, no extra connections may be required for communication with the ASIC, so no extra heat may be lost from the final TCOCXO assembly. The compensation scheme of the ASIC may be relatively flexible in that up to a fourth order polynomial is available for compensation and each order can be scaled positive and negative from zero to its maximum value. The ASIC allows general temperature compensation that is not just confined to AT-cut TCXO compensation.

Figure 9:
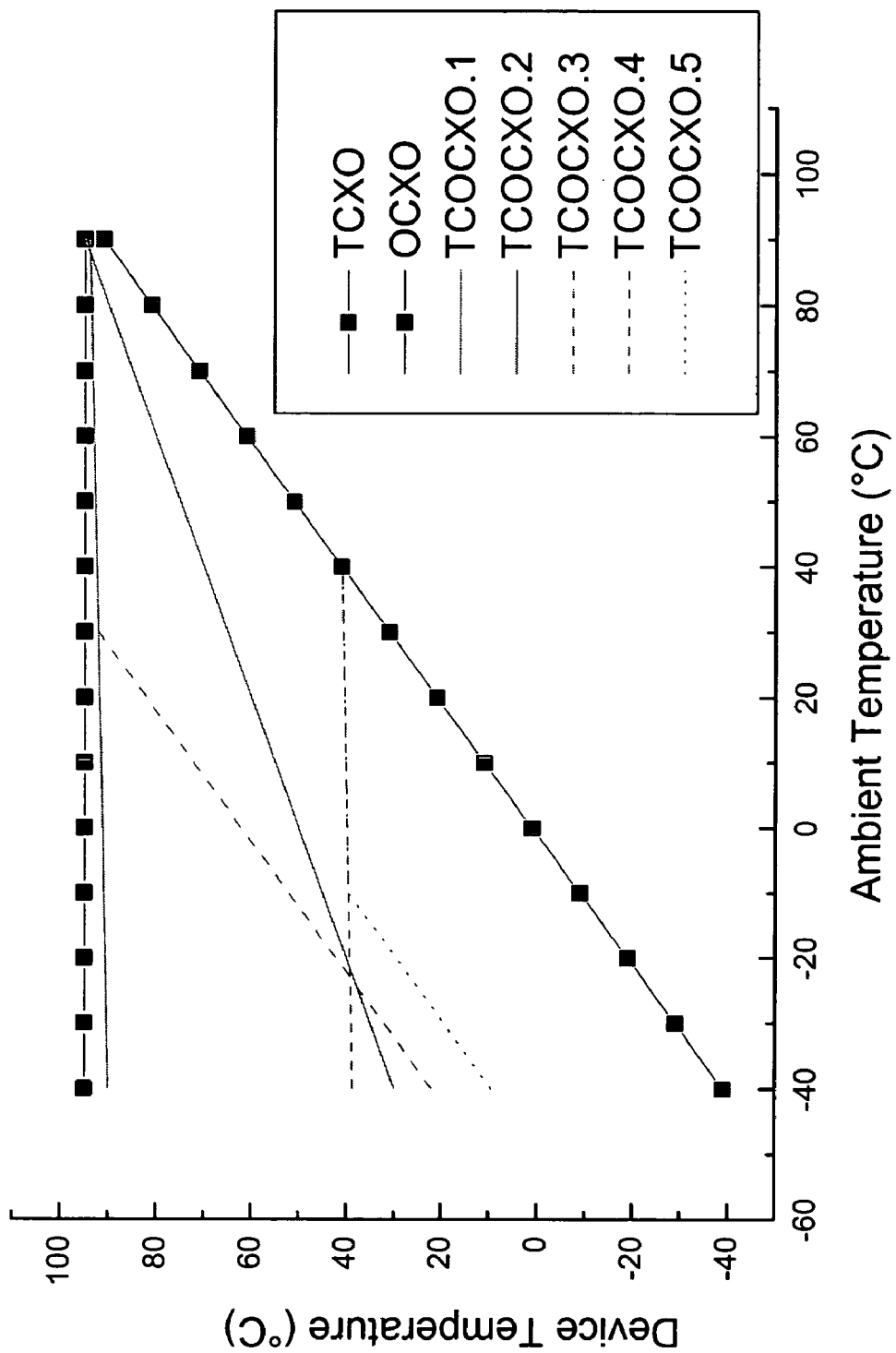
FIG. 9 depicts an embodiment of oven temperature control regimes.

The oven temperature control regimes, as illustrated in FIG. 9, may include:

TCXO: No heating and the device tracks ambient temperature.

OCXO: The device's temperature is accurately maintained.

TCOCXO.1: The device's temperature is as tightly controlled as size and complexity will allow, but moves a couple of percent of the ambient swing. This is believed to be best TCOCXO for frequency stability, but requires higher power consumption than alternative TCOCXO oven configurations.

TCOCXO.2: The device's temperature is not at all tightly controlled. The heater is active over the entire operating range. By not maintaining the rigid device temperature, a lower power consumption can be achieved.

TCOCXO.3: A maximum heater current limit is set. At high ambient temperatures where the required heater current is below this current, the device's temperature is fairly constant. At low ambient temperatures, the heater current is limited and the device temperature drops with the same gradient as that of the ambient temperature. This technique is useful in lower power and current limited applications.

TCOCXO.4: The open set point is located well inside the operating temperature range. With ambients above the set point, the oven is inactive. Below this point, the oven controls the device's temperature. With the device temperature held lower than in TCOCXO.1, a lower power consumption is achieved. and/or TCOCXO.5: The same control regime as TCOCXO.4 but with an addition low current limit, allowing the device to have the same thermal gradient as the ambient. This reduces the power consumption further, but increases the temperature swing seen by the TCXO.

In the case of regime 3, the frequency stability performance can be optimized if the temperature at which current limiting occurs matches a zero in the crystal temperature coefficient. In the case of regime 4, the frequency stability performance can be optimized if the oven set point coincides with a zero in the crystal temperature coefficient. Additionally, in the case of regime 5, the temperature at which current limiting occurs should match a region of zero temperature coefficient for the crystal. By suitable choice of the AT-cut crystal angle all these requirements can be readily achieved.

To compensate an oven controlled oscillator, for example, in a small package requires an understanding of the various compensation schemes and/or access to a suitable compensation ASIC such as, for example, the "Pluto" ASIC.

A TCOCXO temperature compensates a temperature controlled frequency source such as, for example, an OCXO. In a temperature controlled frequency source, a frequency source may be held or restrained in a temperature range. A OCTCXO, as disclosed in the '340 patent, temperature controls (i.e., bakes) a TCXO. In a TCXO, a temperature of a frequency source varies with ambient temperature and a frequency variation resulting from the ambient temperature change is corrected (compensated for). The approaches of the TCOCXO and the OCTCXO are significantly different, as the heat flow through the TCXO, as disclosed in the '340 patent, degrades the performance of the TCXO. C-MAC measurements show that at least an order of magnitude performance increase can be obtained by temperature compensating an OCXO, as compared to temperature controlling a TCXO.

The foregoing presentation of the described embodiments is provided to enable any person skilled in the art to make or use the present invention. Various modifications to these embodiments are possible, and the generic principles presented herein may be applied to other embodiments as well. As such, the present invention is not intended to be limited to the embodiments shown above, and/or any particular configuration of structure but rather is to be accorded the widest scope consistent with the principles and novel features disclosed in any fashion herein.

What is claimed is:

1. A method of compensating for temperature-dependent behavior of a tunable circuit, the method comprising:

providing a temperature controlled frequency source; and
reducing the effects of temperature variations on an operating frequency of the temperature controlled frequency source by temperature compensating the temperature controlled frequency source on the basis of temperature correcting data derived during a calibration process, said calibration process including activating temperature control of the temperature controlled frequency source;
wherein heating of the temperature controlled frequency source is activated in response to the ambient temperature falling below a predetermined value; and
wherein the predetermined value substantially corresponds to a zero temperature coefficient associated with the temperature controlled frequency source.

2. The method of claim 1, wherein the temperature controlled frequency source includes an OCXO.

3. The method of claim 1, wherein the temperature compensation is provided by using a TCXO ASIC.

4. The method of claim 1, wherein the temperature compensation includes fourth-order analog temperature compensation.

5. The method of claim 4, wherein the fourth-order analog temperature compensation is provided by generating zero to fourth-order polynomial Chebyshev functions of temperature.

6. A temperature compensated temperature controlled frequency source comprising:

an OCXO; and
a TCXO ASIC coupled to the OCXO,
wherein the TCXO ASIC comprises temperature correcting data and is configured to temperature compensate the OCXO on the basis of said temperature correcting data, the temperature correcting data having been derived during a calibration process, said calibration process including activating temperature control of the temperature controlled frequency source;
wherein heating of the temperature controlled frequency source is activated in response to the ambient temperature falling below a predetermined value; and
wherein the predetermined value substantially corresponds to a zero temperature coefficient associated with the temperature controlled frequency source.

7. A method according to claim 1, including setting a maximum current level for the temperature controlled frequency source.

8. A method according to claim 1, including monitoring the ambient temperature and selectively operating the temperature controlled frequency source in dependence on the ambient temperature.

* * * * *